United States Patent [19]

Baltar et al.

[11] Patent Number: 5,663,923
[45] Date of Patent: Sep. 2, 1997

[54] NONVOLATILE MEMORY BLOCKING ARCHITECTURE

[75] Inventors: Robert L. Baltar, Folsom; Mark E. Bauer, Cameron Park; Kevin W. Frary, Fair Oaks; Steven D. Pudar, Sunnyvale; Sherif R. Sweha, El Dorado Hills, all of Calif.

[73] Assignee: Intel Corporation, Santa Clara, Calif.

[21] Appl. No.: 430,882

[22] Filed: Apr. 28, 1995

[51] Int. Cl.⁶ .................................................. G11C 7/00
[52] U.S. Cl. .................. 365/230.03; 365/185.33; 365/63; 365/52
[58] Field of Search ................. 365/230.03, 185.33, 365/63, 52

[56] References Cited

U.S. PATENT DOCUMENTS

| | | | |
|---|---|---|---|
| 4,849,943 | 7/1989 | Pfennings | 365/230.03 |
| 4,918,662 | 4/1990 | Kondo | 365/210 |
| 4,935,898 | 6/1990 | Miyaoka et al. | 365/230.03 |
| 4,939,696 | 7/1990 | Katsuo et al. | 365/230.03 |
| 4,958,326 | 9/1990 | Sakurai | 365/218 |
| 4,961,164 | 10/1990 | Miyaoka et al. | 365/177 |
| 4,967,399 | 10/1990 | Kuwabara et al. | 365/230.03 |
| 4,977,538 | 12/1990 | Anami et al. | 365/230.03 |
| 5,007,023 | 4/1991 | Kim et al. | 365/203 |
| 5,065,364 | 11/1991 | Atwood et al. | 365/185 |
| 5,132,928 | 7/1992 | Hayashikoshi et al. | 365/63 |
| 5,239,505 | 8/1993 | Fazio et al. | 365/185 |
| 5,245,570 | 9/1993 | Fazio et al. | 365/185 |
| 5,263,002 | 11/1993 | Suzuki et al. | 365/230.03 |
| 5,274,597 | 12/1993 | Ohbayashi et al. | 365/204 |
| 5,416,748 | 5/1995 | Fujita | 365/230.03 |

*Primary Examiner*—David C. Nelms
*Assistant Examiner*—Vu A. Le
*Attorney, Agent, or Firm*—Blakely, Sokoloff, Taylor & Zafman

[57] ABSTRACT

A nonvolatile memory includes a global line and a first block and a second block. The first block includes a plurality of first local lines and a first local decoder coupled to the global line and the first local lines for selectively coupling the global line to one of the first local lines in accordance with an address when the first local decoder is enabled and for isolating the first local lines from the global line when the first local decoder is disabled. The second block includes a plurality of second local lines and a second local decoder coupled to the global line and the second local lines for selectively coupling the global line to one of the second local lines in accordance with the address when the second local decoder is enabled and for isolating the second local lines from the global line when the second local decoder is disabled such that interference between the first and second blocks is eliminated during memory operations.

25 Claims, 4 Drawing Sheets

NONVOLATILE MEMORY BLOCKING ARCHITECTURE

FIELD OF THE INVENTION

The present invention pertains to the field of computer memories. More particularly, this invention relates to an electrically erasable and programmable nonvolatile memory incorporating blocks and local decoders for the blocks.

BACKGROUND OF THE INVENTION

One type of prior art flash Erasable and electrically Programmable Read-Only Memory ("flash EPROM") is organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. FIG. 1 shows the above-described array configuration of a prior art flash EPROM.

The flash EPROM can be programmed by a user, and once programmed, the flash EPROM retains its data until erased. When programmed, the flash EPROM is programmed byte by byte or word by word. Once programmed, the entire contents of the flash EPROM can be erased by electrical erasure in one relatively rapid operation. A high erasing voltage is made available to the sources of all the cells in the flash EPROM simultaneously. This results in a full array erasure. The flash EPROM may then be reprogrammed with new data.

One disadvantage of this prior flash EPROM structure is the characteristics of array erasure. When changes are sought to be made to a program stored in the array, the entire array must be erased and the entire program be rewritten into the array, even when the changes are minor.

One prior approach to solving this problem is to reorganize the array into blocks so that the high erasing voltage is made available only to the source of every cell within one block to be erased. By this arrangement, only a block of the memory array is erased, rather than having the entire memory array erased.

One disadvantage of this prior approach is that interference can arise from the blocked array configuration of the flash EPROM. This interference can be of two types. One type is referred to as drain disturbance. Drain disturbance arises when the drains of cells along a column are interconnected across a block boundary. Another type of interference is referred to as gate disturbance. Gate disturbance arises when the gates of cells along a row are interconnected across a block boundary.

An example of "gate disturbance" is as follows. A prior flash EPROM is divided into "bit line blocks" by organizing bit lines into groups. During programming of the flash EPROM, a high voltage $V_{pp}$ (typically 12 volts) is applied to the control gate of a selected cell in a selected block through a selected word line. A program voltage $V_P$ (typically 7 volts) lower than $V_{pp}$ is applied to the drain of the selected cell through a selected bit line. The sources of all the cells within the selected block are grounded during the operation. The gates of unselected cells along unselected word lines both in the selected block and unselected blocks are grounded. The drains of unselected cells along unselected bit lines both in the selected block and unselected blocks are either left floating or grounded.

In this situation, the unselected cells along the selected word line will have the high positive voltage $V_{pp}$ (i.e., 12 volts) coupled to their floating gates. An electric field is thus present across each of the unselected cells along the selected word line. The presence of the electric field across each of the unselected cells can cause movement of electrons to the floating gates. This increases the threshold of these unselected cells, causing those unselected cells to be slowly programmed. This is referred to as slow programming. Thus, gate disturbance can result in unwanted slow programming.

An example of "drain disturbance" is as follows. A prior flash EPROM is divided into "word line blocks" by organizing word lines into groups. During programming of the flash EPROM, a high voltage $V_{PP}$ of 12 volts is applied to the control gate of a selected cell in a select block through a selected word line. A program voltage $V_P$ of 7 volts is applied to the drain of the selected cell through a selected bit line. The drain of unselected cells along the selected bit line both in the selected block and unselected blocks will be coupled to the voltage $V_P$ of 7 volts. The gates of the unselected cells will be grounded. This creates an electric field across each of the unselected cells along the selected bit line, which causes unwanted movement of electrons from the floating gate to the drain. Thus the threshold of each of the unselected cells is decreased by unwanted movement of electrons, causing those unselected cells to be slowly erased. This is referred to as slow erasing. Thus, drain disturbance can result in unwanted slow erasing.

"Gate disturbance" and "drain disturbance" are especially pernicious because their effects accumulate as either programming or erasing of a selected block of a flash EPROM is repeated. Unwanted movement of electrons in certain unselected cells happens each time there is a programming or erasure operation.

For gate disturbance, the thresholds of unselected cells keep increasing, and the unselected cells are slowly programmed. For drain disturbance, the thresholds of unselected cells keep decreasing, and the unselected cells are slowly erased. If the accumulated gate or drain disturbances reach a certain degree on an unselected cell, the state of the unselected cell can be completely altered. In other words, an unselected cell could be unintentionally programmed or erased over time.

SUMMARY OF THE INVENTION

One of the features of the present invention is to provide a nonvolatile memory that is organized into blocks and that includes a block erasure feature.

Another feature of the present invention is to provide a nonvolatile memory that is organized into blocks and that includes local decoders for eliminating interference between the blocks.

A further feature of the present invention is to allow a nonvolatile memory to be reconfigured with different storage capacity.

A nonvolatile memory includes a global line and a first block and a second block. The first block includes a plurality of first local lines and a first local decoder coupled to the global line and the first local lines for selectively coupling the global line to one of the first local lines in accordance with an address when the first local decoder is enabled and for isolating the first local lines from the global line when the first local decoder is disabled. The second block includes a plurality of second local lines and a second local decoder coupled to the global line and the second local lines for selectively coupling the global line to one of the second local lines in accordance with the address when the second local decoder is enabled and for isolating the second local lines from the global line when the second local decoder is disabled such that interference between the first and second blocks during memory operations is eliminated.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
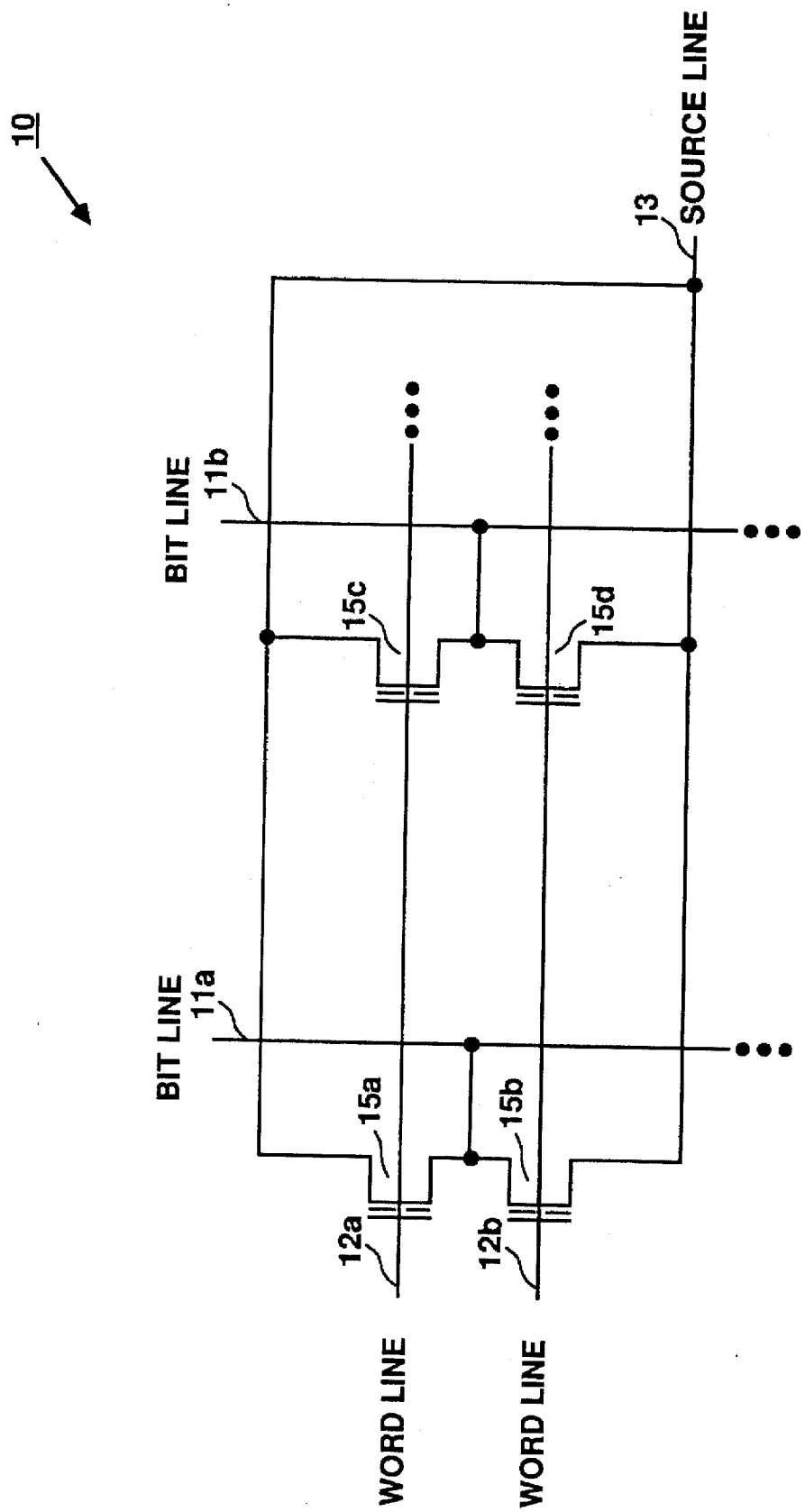
FIG. 1 shows the array configuration of a prior art flash EPROM.
Figure 2:
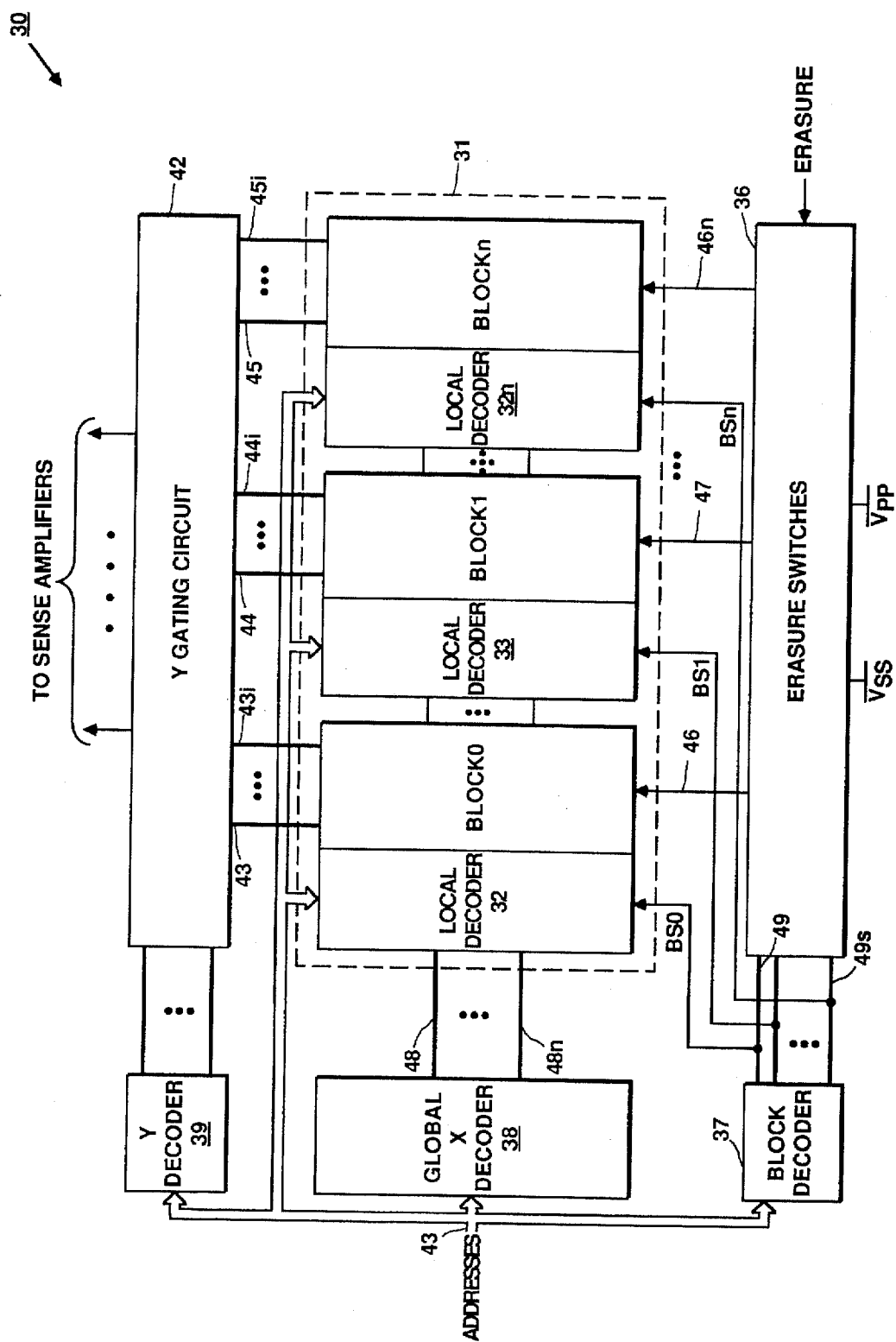
FIG. 2 is a block diagram of a flash EPROM that employs one embodiment of the present invention.

FIG. 2 is a block diagram of the circuitry of flash EPROM 30, which implements an embodiment of the present invention. Flash EPROM 30 includes a memory array 31, which is made up of floating gate flash EPROM cells that store data at addresses. For one embodiment, memory array 31 stores 16 Mbits ("Megabits") of data. For alternative embodiments, memory array 31 can be smaller than or larger than 16 Mbits.

Alternatively, flash EPROM 30 can be other types of nonvolatile memories. For example, flash EPROM 30 can simply be an EPROM ("Electrically Programmable Read-Only Memory").

As will be described in more detail, flash EPROM 30 includes a memory array that is arranged into a number of blocks, each having a local decoder. When a local decoder of a block is enabled by a block select signal, the local decoder selects a local line of the block to connect to a selected one of a number of global lines that extend through all the blocks of the memory array. When the local decoder is disabled by the block select signal, the local decoder isolates all the local lines of the respective block from the global lines. By doing so, each of the blocks is isolated from another block. This in turn eliminates interference between the blocks during memory operations. In addition, flash EPROM 30 is allowed to be reconfigured with partial storage capacity when one or more block of the memory array is found to be defective. Moreover, block redundancy can also be employed for flash EPROM 30.

Flash EPROM 30 can be used in any kind of computer system or data processing system. The computer system within which flash EPROM 30 is used can be a personal computer, a notebook, a laptop, a personal assistant/ communicator, a minicomputer, a workstation, a mainframe, a multiprocessor computer, or any other type of computer system. In addition, the system in which flash EPROM 30 is used can be a printer system, a cellular phone system, a digital answering system, or any other data storage system.

For one embodiment, flash EPROM 30 employs MOS circuitry and all the circuitry of flash EPROM 30 resides on a single semiconductor substrate.

For one embodiment, each memory cell of memory array 31 can store one bit of data at one time. For another embodiment, each memory cell of memory array 31 can store multiple bits of data at one time.

Memory array 31 is divided into a number of blocks BLOCK0 through BLOCKn. Each of blocks BLOCK0 through BLOCKn includes a local decoder. For example, block BLOCK0 includes a local decoder 32 and block BLOCK1 includes a local decoder 33. Each block of blocks BLOCK0 through BLOCKn includes a number of bit lines and local word lines (not shown in FIG. 2). The bit lines of a block only extend within that particular block and the local word lines of a block only extend within the block. For example, bit lines 43 through 43$i$ extend only within BLOCK0 and bit lines 45 through 45$i$ extend only within block BLOCKn. Memory cells are placed at intersections of the local word lines and bit lines. All the bit lines of memory array 31 are connected to a Y decoder 39 via a Y gating circuit 42.

Figure 3:
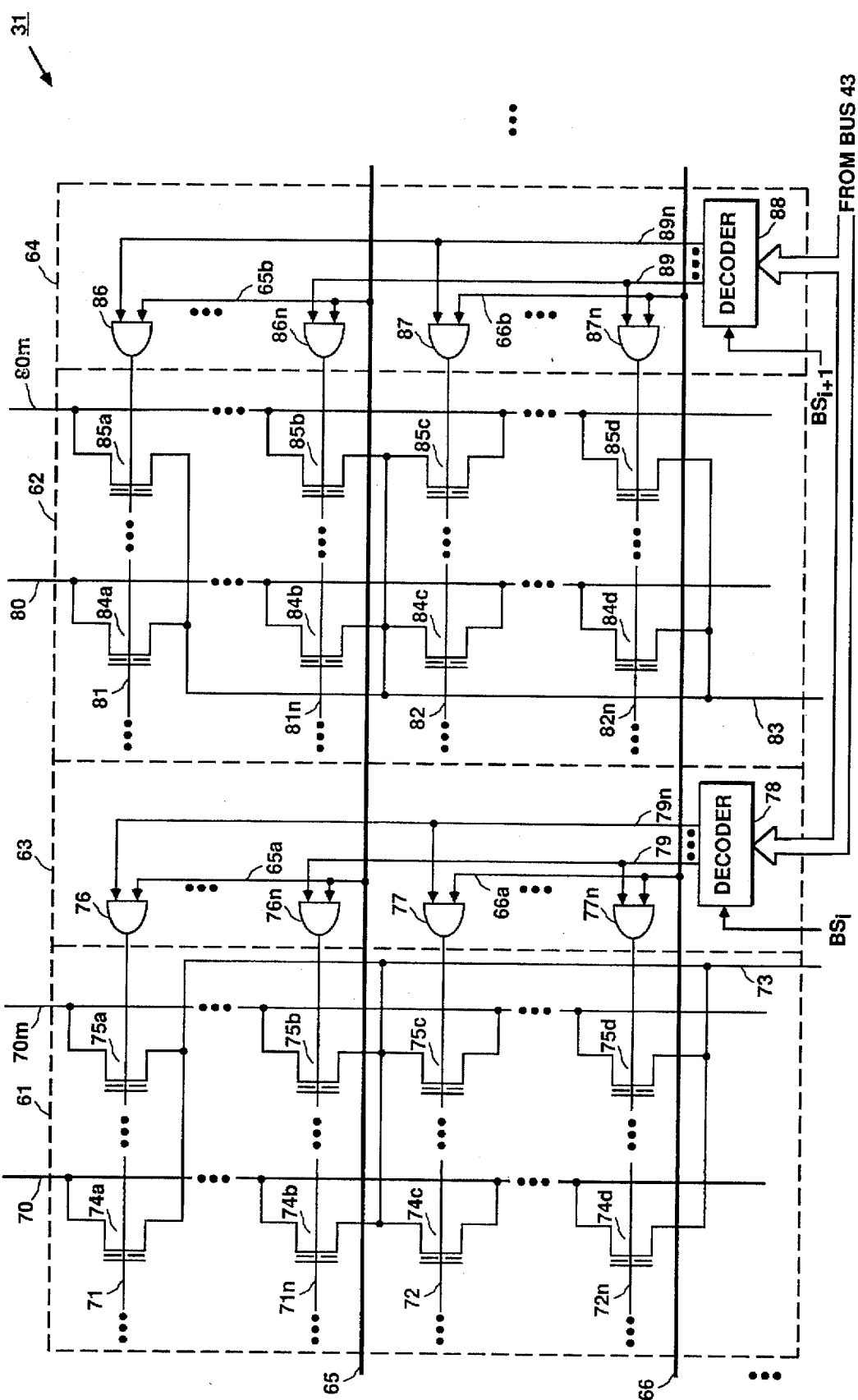
FIG. 3 illustrates one array configuration of the flash EPROM of FIG. 2.
Figure 4:
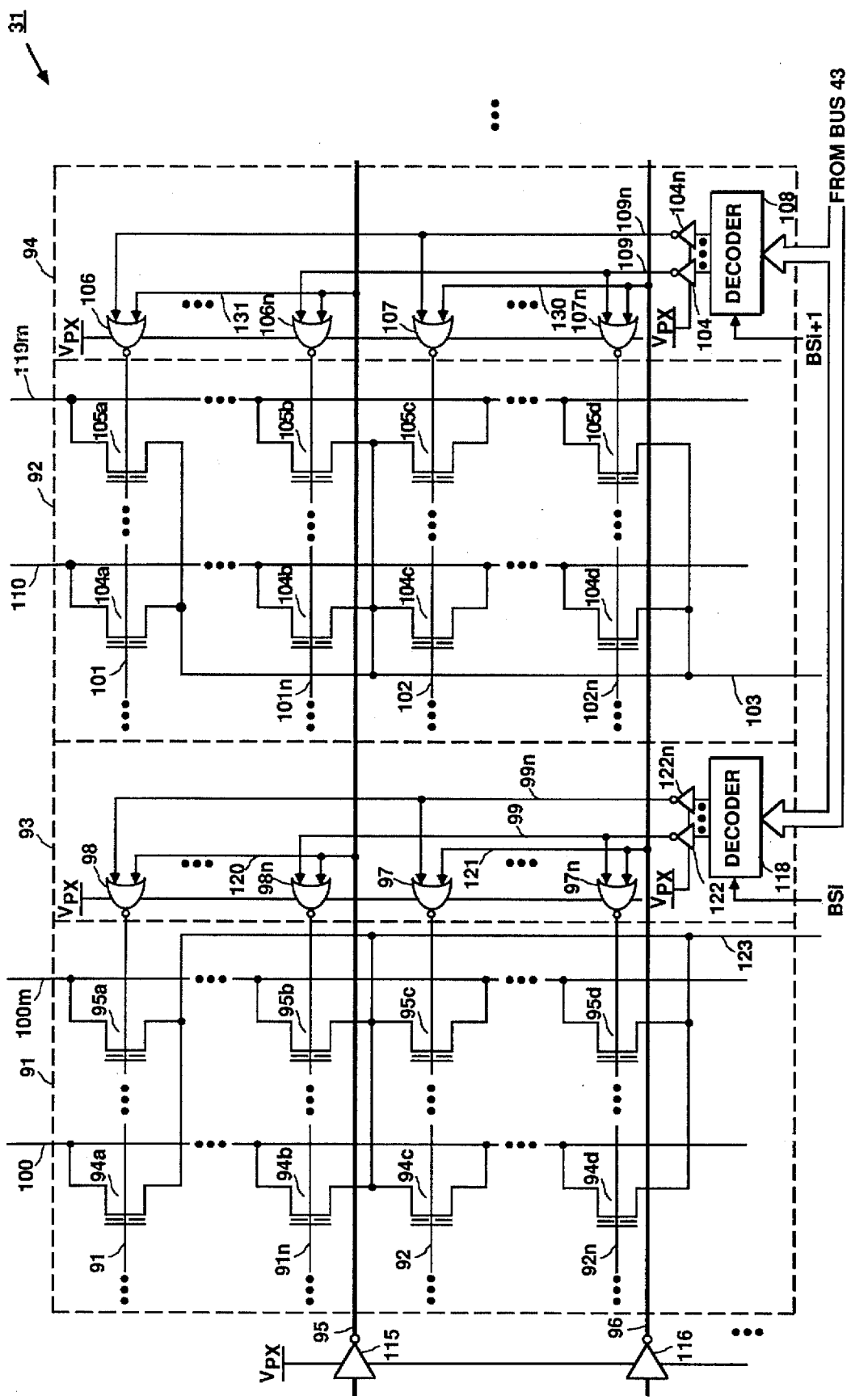
FIG. 4 illustrates another array configuration of the flash EPROM of FIG. 2.

The local word lines within each of blocks BLOCK0–BLOCKn are connected to the local decoder of the respective block. In addition, memory array 31 also includes a number of global word lines 48 through 48$n$ connected to a global X decoder 38. Global word lines 48–48$n$ are connected to each of local decoders 32 through 32$n$. Global word lines 48–48$n$ extend through all of blocks BLOCK0–BLOCKn. Global word lines 48–48$n$ are, however, not physically connected to the local word lines of each block of memory array 31 but can be electrically connected to the local word lines of each block via the respective local decoder of that block. For example, local decoder 32 allows each of global word lines 48–48$n$ to be connected to one of the local word lines of block BLOCK0. For one embodiment, the local word lines in each of the blocks of memory array 31 are coupled to the global word lines via the respective local decoder in such a way that each global word line corresponds to several local word lines within one block. In other words, the local decoder of a block selects one local word line from a number of local word lines for one of the global word lines for every address information it receives. Whether a selected local word line is actually a selected line depends on whether its corresponding global word line is a selected global line. For another embodiment, the local word lines within a block have a one-to-one correspondence with global word lines 48–48$n$. FIG. 2 does not show the local word lines within each of the blocks of memory array 31. FIGS. 3–4 show the array configurations of each block of memory array 31, including local decoders and local word lines, which will be described in more detail below.

Alternatively, array 31 can be arranged such that each of blocks BLOCK0–BLOCKn includes a number of word lines and local bit lines. The word lines of a block only extend within that particular block and the local bit lines of a block only extend within the block. The word lines of all the blocks are then connected to X decoder 38. The local bit lines within a block are connected to the local decoder of that block. In this case, instead of having global word lines, a number of global bit lines are provided to connect to all the local decoders of memory array 31. The global bit lines are connected to Y decoder 39 via Y gating circuit 42. The global bit lines also extend through all the blocks of BLOCK0–BLOCKn. For this embodiment, Y decoder 39 is the global Y decoder and X decoder 38 does not have corresponding local decoders.

Referring again to FIG. 2, X decoder 38 is the row decoder of memory array 31 and receives a portion of a row address from an address bus 43 to select one of global word lines 48–48$n$. X decoder 38, however, does not select any local word line within each block of memory array 31.

Each of local decoders 32–32$n$ is also connected to bus 43 to receive the remaining portion of the row address for selecting a local word line from a number of local word lines corresponding to a global word line via the respective local decoder. For one embodiment, bus 43 applies (1) a number of least significant bits of a row address to each of local decoders 32–32n and (2) the remaining most significant bits of the row address to X decoder 38. Alternatively, X decoder 38 receives a number of least significant bits of a row address while bus 43 applies the remaining most significant bits of the row address to each of local decoders 32–32n. In addition, each of local decoders 32–32n also receives a block select signal from a block decoder 37. For example, local decoder 32 receives a block select signal BS0 and local decoder 32n receives a block select signal BSn. The block select signal for a local decoder, when asserted, causes the respective local decoder to act on the address information applied via bus 43. When the block select signal for a local decoder is not asserted, the respective local decoder is disabled. This therefore allows the local word lines of a block to be isolated from the global word lines and from the local word lines of other blocks during memory operations.

Alternatively, each of local decoders 32–32n is not connected to bus 43. Instead, each of local decoders 32–32n receives the address information or select data from global word lines 48–48n. In this case, global X decoder 38 decodes an X address to generate a select data onto two or more of global word lines 48–48n. In addition, the local decoder for each block is formed by a number of two-to-four, three-to-eight, or four-to-sixteen decoders, depending on the select data. Depending on the type of the decoders used in each of local decoders 32–32n, the select data is applied to two, three, or four of global word lines 48–48n. For example, if each of local decoders 32–32n includes a number of two-to-four decoders, the select data is applied to two of global word lines 48–48n. If each of local decoders 32–32n includes a number of three-to-eight decoders, the select data is applied to three of global word lines 48–48n. When an enabled local decoder receives the select data, it decodes the select data and selects one of the local word lines of the corresponding block.

Block decoder 37 is also connected to erasure switches 36 via block select lines 49 through 49s. Block select lines 49–49s apply each of the block select signals BS0–BSn to the corresponding local decoder.

Block decoder 37 selects a selected block for every block address applied. Block decoder 37 selects the selected block by enabling the local decoder of the selected block. Block decoder 37 does this by asserting the appropriate one of the block select signals BS0–BSn. Block decoder 37 is also connected to bus 43 for receiving the block address. For one embodiment, the block address of flash EPROM 30 is part of the column address received in Y decoder 39.

Erasure switches 36 include a number of switches (not shown in FIG. 2), each being coupled to the common source line of one block of blocks BLOCK0–BLOCKn. Each of erasure switches 36 selectively connects the $V_{SS}$ (i.e., ground) or $V_{PP}$ (i.e., erasure) voltage to one of common source lines 46–46n of its associated block in accordance with the block select signal from one of select lines 49–49s and in accordance with the memory operations (i.e., read, programming, and erasure operations). This means that erasure switches 36 will apply the $V_{SS}$ voltage to all common source lines 46–46n during read and programming operations of flash EPROM 30 regardless of the block select signals BS0–BSn. When flash EPROM 30 undergoes the erasure operation (indicated by the ERASURE signal) block decoder 37 asserts the selected block signal that causes the corresponding switch of erasure switches 36 to apply the $V_{PP}$ voltage to the selected block while other switches of erasure switches 36 apply the $V_{SS}$ voltage to their blocks.

By isolating global word lines 48–48n from the local word lines of each of blocks BLOCK0–BLOCKn, global word lines 48–48n are separated from each of the blocks of memory array 31 and do not disturb other blocks of memory array 31 when one block of memory array 31 is selected for a memory operation (e.g., the programming operation). In other words, the memory cells of the unselected blocks of memory array 31 do not experience any gate disturbance when a selected block undergoes the programming operation. This in turn causes erasure switches 36 not to apply any disturb inhibit potential to the sources of the cells of the unselected blocks when the select cells of the selected block undergo the programming operation, thus eliminating the need for such voltage in flash EPROM 30.

In addition, because each of the blocks of memory array 31 is isolated from each other by the local decoder and the local word lines of the respective block, some of blocks BLOCK0–BLOCKn may be permanently disabled without affecting memory operations of adjacent blocks. This is typically useful when one or more of blocks BLOCK0–BLOCKn is found defective. In this case, memory array 31 may be reconfigured to function without the defective block (i.e., with partial storage capacity). This allows memory array 31 to still function with reduced number of blocks when memory array 31 contains defective blocks. Alternatively, blocks BLOCK0–BLOCKn include a number of redundant blocks for replacing defective blocks in memory array 31. This means that flash EPROM 30 can have block redundancy. The block redundancy scheme is described in co-pending application Ser. No. 08/430,344, entitled NONVOLATILE MEMORY BLOCKING ARCHITECTURE AND REDUNDANCY, by Owen W. Jungroth and Mark D. Winston, filed on even date as the present application, and assigned to the same assignee of the present application.

Referring to FIG. 3, the array configuration of memory array 31 in accordance with one embodiment of the present invention is shown. FIG. 3 only shows two blocks 61 and 62 for illustration purposes. Blocks 61 and 62 can be any two adjacent blocks of BLOCK0–BLOCKn of FIG. 2. As can be seen from FIG. 3, each of blocks 61 and 62 includes one of local decoders 63 and 64. In addition, FIG. 3 only shows two global word lines 65 and 66 that extend through blocks 61 and 62 for illustration purposes. In practice, many more global word lines are included that extend through many blocks. Global word lines 65 and 66 can be any two adjacent global word lines of global word lines 48–48n of FIG. 2.

Block 61 includes bit lines 70 through 70m and block 62 includes bit lines 80 and 80m. In addition, each of blocks 61 and 62 includes a number of local word lines connected to a global word line via the respective local decoder. For example and in block 61, local word lines 71 through 71n are connected to global word line 65 via local decoder 63 and local word lines 72 through 72n are connected to global word line 66 via local decoder 63. Similarly in block 62, local word lines 81 through 81n are connected to global word line 65 via local decoder 64 and local word lines 82 through 82n are connected to global word lines 66 via local decoder 64. In other words, local word lines 71–71n correspond to global word line 65 and local word lines 72–72n correspond to global word line 66.

Block 61 includes a common source line 73 and block 62 includes a common source line 83. Each of common source lines 73 and 83 is connected to an erasure switch of erasure switches 36 (FIG. 2). In addition, each of blocks 61–62 includes a number of flash EPROM cells arranged at the intersections of the bit lines and local word lines of that block. FIG. 3 shows cells 74a through 75d for block 61 and cells 84a through 85d for block 62. Each cell in one block has its drain connected to one bit line, it control gate connected to one local word line and its source connected to the common source line of that block. For example, cell 74a has its drain connected to bit line 70, its control gate connected to local word line 71, and its source connected to source line 73. It shall be noted that none of the cells within each of blocks 61 and 62 is physically connected to global word lines 65 and 66. Bit lines 70–70m and 80–80m are then connected to Y gating circuit 42 (FIG. 2).

Local decoder 63 includes an address decoder 78 and a number of AND gates. FIG. 3 shows AND gates 76 through 76n and 77 through 77n for local decoder 63. Each of AND gates 76–76n connects global word line 65 to one of local word lines 71–71n. Each of AND gates 77–77n connects global word line 66 to one of local word lines 72–72n. In addition, each of AND gates 76–76n and 77–77n is also connected to decoder 78 via one of a number of select lines 79 through 79n. For example, select line 79 is connected to AND gates 76n and 77n and select line 79n is connected to AND gates 76 and 77. Each of AND gates 76–76n and 77–77n is enabled by one of select lines 79–79n to connect its respective global word line to its respective local word line. For example, when decoder 78 decodes the address information from bus 43 to select line 79, both AND gates 76n and 77n are enabled to connect its respective one of global word lines 65 and 66 to its respective one of local word lines 71n and 72n. At this time, local word line 71n is the selected line if global word line 65 is the selected line and local word line 72n is the selected line if global word line 66 is the selected line.

Similarly, local decoder 64 includes an address decoder 88 and a number of AND gates. FIG. 3 shows AND gates 86 through 86n and 87 through 87n for local decoder 64. Each of AND gates 86–86n connects global word line 65 to one of local word lines 81–81n. Each of AND gates 87–87n connects global word line 66 to one of local word lines 82–82n. In addition, each of AND gates 86–86n and 87–87n is also connected to decoder 88 via one of a number of select lines 89 through 89n. For example, select line 89 is connected to AND gates 86n and 87n and select line 89n is connected to AND gates 86 and 87. Each of AND gates 86–86n and 87–87n is enabled by one of select lines 89–89n to connect its respective global word line to its respective local word line. For example, when decoder 88 decodes the address information from bus 43 to select line 89, both AND gates 86n and 87n are enabled to connect its respective one of global word lines 65 and 66 to its respective one of local word lines 81n and 82n. When this occurs, local word line 81n is the selected line if global word line 65 is the selected line and local word line 82n is the selected line if global word line 66 is the selected line.

Address decoder 78 of local decoder 63 receives a block select BSi signal and address decoder 88 of local decoder 64 receives a block select BSi+1 signal. The block select signals BSi and BSi+1 can be any two of the block select signals BS0–BSn from block decoder 37 of FIG. 2. When the BSi signal is asserted, decoder 78 is enabled to decode the address information from bus 43 to select one of select lines 79–79n. When the block select BSi+1 signal is asserted, address decoder 88 is enabled to decode the address information from bus 43 to select one of select lines 89–89n.

For one embodiment, each of local word lines 71–71n, 72–72n, 81–81n, and 82–82n is formed by a continuous polysilicon strip that also forms the control gate of each of the flash EPROM cells along one row. For example, local word line 71 is formed by a polysilicon strip that also forms the control gate of each of the flash EPROM cells 74a through 75a. Likewise, local word line 81 of block 62 is formed by a polysilicon strip that also forms the control gate of each of flash EPROM cells 84a through 85a. Each of global word lines 65 and 66 is formed by a second metal layer that is above a first metal layer that forms each of the bit lines of memory array 31. The first metal layers in a block are above the polysilicon strips that form the local word lines within that block.

It shall be noted that FIG. 3 only shows one embodiment of the present invention for local decoders 63 and 64. Other embodiments may also be employed for memory array 31. FIG. 4 shows another embodiment of memory array 31. As can be seen from FIG. 4, the array configuration of memory array 31 is the same as that shown in FIG. 3, except NOR gates 97 through 97n, 98 through 98n, 106 through 106n, and 107 through 107n are employed for local decoders 93 and 94. In addition, inverters 115 and 116 are connected to global word lines 95 and 96. Moreover, the address decoder in each of local decoders 93 and 94 is connected to its select lines via a number of inverters. For example, address decoder 118 is connected to select lines 99 through 99n via inverters 122 through 122n. The overall function of memory array 31 shown in FIG. 4 remains substantially the same as that of the memory array shown in FIG. 3, and therefore will not be described in more detail below.

Referring to FIGS. 2–4, the operation of flash EPROM 30 is now described. For one embodiment, during read operation, the selected one of local decoders 32–32n of flash EPROM 30 is enabled by the block decoder 37 and Y decoder 39 selects one byte or one word of bit lines in accordance with the column address applied. In addition, global X decoder 38 selects one of global word lines 48–48n. The enabled one of local decoders 32–32n for the selected block also selects one local word line in the selected block to connect to the selected global word line. When this occurs, only the memory cells at the intersections of the selected bit lines and the selected local word line are read out. In addition, erasure switches 36 connect the $V_{SS}$ voltage to the sources of all the memory cells of memory array 31.

For another embodiment, flash EPROM 30 includes configuration cells that configures block decoder 37 to disable the local decoder of a block found to be defective at device power-up.

During programming operation, block decoder 37 asserts one of the block select signals BS0–BSn in accordance with a column address. This causes one of local decoders 32–32n to be enabled to decode the partial row address information from bus 43 while others of local decoders 32–32n are disabled. X decoder 38 selects a selected global word line of global word lines 48–48n and applies a programming $V_{PP}$ voltage to the selected global word line. Y decoder 39 selects a byte or word of bit lines within the selected block. As can be seen from FIG. 3, when local decoder 64 is disabled, none of local word lines 81–81n and 82–82n can be connected to global word lines 65 and 66, even though one of global word lines 65 and 66 is a selected word line. This eliminates the interferences between blocks during programming operation. For example, when local decoder 63 causes local word line 71 to be connected to selected global word line 65 for a programming operation, the high programming $V_{PP}$ voltage along global word line 65 is not connected to unselected memory cells 84a through 85a of block 62 to disturb these unselected cells. In other words, the cells of unselected blocks of memory array 31 do not experience any gate disturbance when a select block undergoes the read or programming operation.

Moreover, because global word lines 48–48n are not physically connected to the memory cells within each block of memory array 31 and are a number of layers above the local word lines of each block, each of global word lines 48–48n is not affected when its corresponding local word lines in one block is found defective. For example, if local word line 71 of block 61 is found defective, global word line 65 is affected. This is due to the fact that local decoder 63 separates local word lines 71–71n of block 61 from global word line 65. This in turn causes each of local word lines 81–81n of block 62 not to be affected at all by the defect along local word line 71. Erasure switches 36 (FIG. 2) connect the $V_{SS}$ voltage to all of source lines 46–46n during the programming operation.

During erasure operation, block decoder 37 selects the selected block of array 31 by applying the $V_{PP}$ voltage to the common source line of the selected block while applying the $V_{SS}$ voltage to the common source lines of other unselected blocks. For example, if block BLOCK1 is the selected block, block decoder 37 asserts the BS1 signal to cause erasure switches 36 to apply the $V_{PP}$ voltage to common source line 47 while deasserting the remaining block select signals of the BS0–BSn signals to apply the $V_{SS}$ voltage to common source lines 46–46n, except common source line 47.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A nonvolatile memory, comprising:
   (A) a global line;
   (B) a first block that comprises
      (i) a plurality of first local lines;
      (ii) a first local decoder coupled to the global line and the first local lines for selectively coupling the global line to one of the first local lines in accordance with an address when the first local decoder is enabled and for isolating the first local lines from the global line when the first local decoder is disabled;
      (iii) a first plurality of nonvolatile memory cells coupled to the first local lines, wherein the first plurality of nonvolatile memory cells are erasable and programmable;
   (C) a second block that comprises
      (i) a plurality of second local lines;
      (ii) a second plurality of nonvolatile memory cells coupled to the second local lines, wherein the second plurality of nonvolatile memory cells are erasable and programmable; and
      (iii) a second local decoder coupled to the global line and the second local lines for selectively coupling the global line to one of the second local lines in accordance with the address when the second local decoder is enabled and for isolating the second local lines from the global line when the second local decoder is disabled such that interference between the first and second block is eliminated during memory operations without coupling a disturb inhibit potential to the second plurality of nonvolatile memory cells.

2. The nonvolatile memory of claim 1, wherein the global line is a global word line and the first and second local lines are first and second local word lines.

3. The nonvolatile memory of claim 1, wherein the global line is a global bit line and the first and second local lines are first and second local bit lines.

4. The nonvolatile memory of claim 1, further comprising a block decoder coupled to the first and second local decoders for selectively enabling one of the first and second blocks by generating a block select signal to the respective one of the first and second local decoders.

5. The nonvolatile memory of claim 1, wherein each of the first and second plurality of nonvolatile memory cells store a plurality of data bits at one time.

6. The nonvolatile memory of claim 1, wherein the first and second plurality of nonvolatile memory cells are electrically programmable and electrically erasable.

7. The nonvolatile memory of claim 1, wherein the nonvolatile memory is for use in a data processing system.

8. A nonvolatile memory comprising:
   (A) a global word line;
   (B) a first block that comprises
      (i) a plurality of first local word lines;
      (ii) a first local decoder coupled to the global word line and the first local word lines for selectively coupling the global word line to one of the first local word lines in accordance with an address when the first local decoder is enabled and for isolating the first local word lines from the global word line when the first local decoder is disabled;
      (iii) a first plurality of nonvolatile memory cells coupled to the first local word lines, wherein the first plurality of nonvolatile memory cells are erasable and programmable;
   (C) a second block that comprises
      (i) a plurality of second local word lines;
      (ii) a second plurality of nonvolatile memory cells coupled to the second local word lines, wherein the second plurality of nonvolatile memory cells are erasable and programmable; and
      (iii) a second local decoder coupled to the global word line and the second local word lines for selectively coupling the global word line to one of the second local word lines in accordance with the address when the second local decoder is enabled and for isolating the second local word lines from the global word line when the second local decoder is disabled such that interference between the first and second block is eliminated during memory operations without coupling a disturb inhibit potential to the second plurality of nonvolatile memory cells.

9. The nonvolatile memory of claim 8, further comprising a block decoder coupled to the first and second local decoders for selectively enabling one of the first and second blocks by generating a block select signal to the respective one of the first and second local decoders.

10. The nonvolatile memory of claim 8, wherein each of the first and second plurality of nonvolatile memory cells store a plurality of data bits at one time.

11. The nonvolatile memory of claim 8, wherein the first and second plurality of nonvolatile memory cells are electrically programmable and electrically erasable.

12. A nonvolatile memory, comprising:
   (A) a global bit line;
   (B) a first block that comprises
      (i) a plurality of first local bit lines;
      (ii) a first local decoder coupled to the global bit line and the first local bit lines for selectively coupling the global bit line to one of the first local bit lines in accordance with an address when the first local decoder is enabled and for isolating the first local bit lines from the global bit line when the first local decoder is disabled;

(iii) a first plurality of nonvolatile memory cells coupled to the first local bit lines, wherein the first plurality of nonvolatile memory cells are erasable and programmable;

(C) a second block that comprises (i) a plurality of second local bit lines;

(ii) a second plurality of nonvolatile memory cells coupled to the second local bit lines, wherein the first plurality of nonvolatile memory cells are erasable and programmable; and (iii) a second local decoder coupled to the global bit line and the second local bit lines for selectively coupling the global bit line to one of the second local bit lines in accordance with the address when the second local decoder is enabled and for isolating the second local bit lines from the global bit line when the second local decoder is disabled such that interference between the first and second blocks is eliminated during memory operations without coupling a disturb inhibit potential the second plurality of nonvolatile memory cells.

13. The nonvolatile memory of claim 12, further comprising a block decoder coupled to the first and second local decoders for selectively enabling one of the first and second blocks by generating a block select signal to the respective one of the first and second local decoders.

14. The nonvolatile memory of claim 12, wherein each of the first and second plurality of nonvolatile memory cells store a plurality of data bits at one time.

15. The nonvolatile memory of claim 12, wherein the first and second plurality of nonvolatile memory cells are electrically programmable and electrically erasable.

16. A nonvolatile memory, comprising:

(A) a global decoder;

(B) a plurality of global lines coupled to the global decoder, wherein the global decoder applies a select data on at least one of the plurality of global lines in accordance with a first portion of an address;

(C) a plurality of blocks, each comprising (i) a plurality of local lines;

(ii) a plurality of nonvolatile memory cells coupled to the plurality of local lines, wherein the nonvolatile memory cells are electrically erasable and programmable; and (iii) a local decoder coupled to the global and local lines for decoding the select data to select one of the local lines when enabled and for isolating the local lines from the global lines when disabled such that a memory operation with respect to one of the nonvolatile memory cells coupled to the selected one of the local lines in one of the blocks does not affect data stored in the nonvolatile memory cells coupled to the isolated local lines in other blocks, and wherein a disturb inhibit potential is not coupled to the nonvolatile memory cells coupled to the isolated local lines during the memory operation.

17. The nonvolatile memory of claim 16, wherein the global lines are global word lines and the local lines are local word lines.

18. The nonvolatile memory of claim 16, wherein the global lines are global bit lines and the local lines are local bit lines.

19. The nonvolatile memory of claim 16, further comprising a block decoder coupled to the local decoder of each of the blocks for selectively enabling the local decoder of one of the blocks by generating a block select signal to that local decoder.

20. The nonvolatile memory of claim 16, wherein the plurality of nonvolatile memory cells are electrically programmable and electrically erasable.

21. The nonvolatile memory of claim 4, further comprising switch circuitry coupled to the first and second local block and the block decoder, wherein the switch circuitry selectively couples a first voltage to the first or second block enabled by the block select signal when erasing one of the first or second plurality of nonvolatile memory cells of the first or second selected block, and wherein the switch circuitry couples a second voltage to each of the first and second local blocks when programming one of the first or second plurality of nonvolatile memory cells regardless of the block select signal.

22. The nonvolatile memory of claim 1, wherein the nonvolatile memory has a storage capacity, and wherein the first local block is a defective block and the nonvolatile memory may be reconfigured to operate at a capacity less than the storage capacity.

23. The nonvolatile memory of claim 22, wherein the second block is a redundant block replacing the defective first block.

24. The nonvolatile memory device of claim 1, wherein the interference eliminated between the first and second block comprises gate disturbance.

25. The nonvolatile memory device of claim 1, wherein the interference eliminated between the first and second block comprises drain disturbance.

* * * * *